(12) United States Patent
Ikuta

(10) Patent No.: US 8,331,414 B2
(45) Date of Patent: Dec. 11, 2012

(54) SURFACE-EMITTING LASER AND SURFACE-EMITTING LASER ARRAY

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 105 days.

(21) Appl. No.: 13/121,677

(22) PCT Filed: Sep. 7, 2010

(86) PCT No.: PCT/JP2010/065687
§ 371 (c)(1),
(2), (4) Date: Mar. 29, 2011

(87) PCT Pub. No.: WO2011/030885
PCT Pub. Date: Mar. 17, 2011

(65) Prior Publication Data
US 2011/0182318 A1 Jul. 28, 2011

(30) Foreign Application Priority Data
Sep. 10, 2009 (JP) .................................. 2009-208974

(51) Int. Cl.
*H01S 5/00* (2006.01)

(52) U.S. Cl. ................ 372/50.124; 372/50.11; 372/50.1

(58) Field of Classification Search ............. 372/50.124, 372/50.11, 50.1
See application file for complete search history.

(56) References Cited

U.S. PATENT DOCUMENTS

| 5,388,120 A * | 2/1995 | Ackley et al. ................... 372/99 |
| 2006/0002444 A1 * | 1/2006 | Wang et al. .................. 372/50.1 |
| 2008/0151961 A1 * | 6/2008 | Kim et al. ....................... 372/94 |

OTHER PUBLICATIONS

Unold et al., "Large-Area Single-Mode VCSELs and the Self-Aligned Surface Relief", IEEE Journal on selected topics in quantum electronics, vol. 7, No. 2, p. 386, Mar./Apr. 2001.

* cited by examiner

*Primary Examiner* — Kinam Park
(74) *Attorney, Agent, or Firm* — Canon USA Inc IP Division

(57) ABSTRACT

A surface-emitting laser includes a surface relief structure provided on an upper multilayer reflector, the surface relief structure including a region of a first laminate, a region of a second laminate that has a larger optical thickness than the first laminate, and a region of a third laminate that has a larger optical thickness than the first laminate and the second laminate.

4 Claims, 13 Drawing Sheets

FIG. 2A
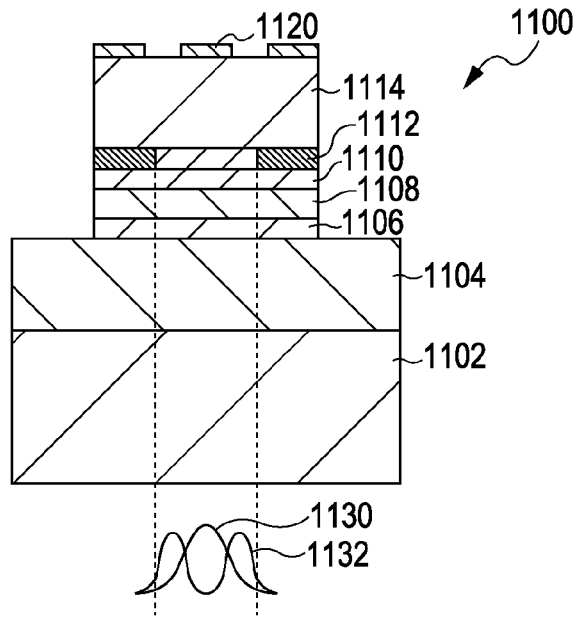
FIG. 2B1
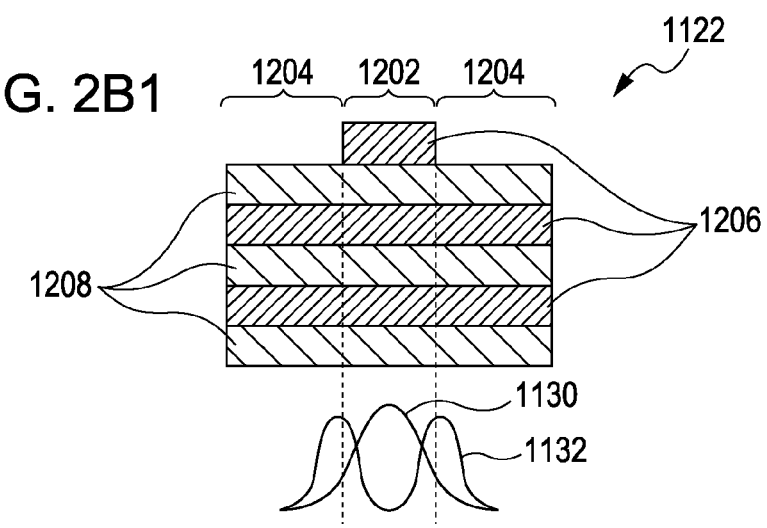
FIG. 2B2
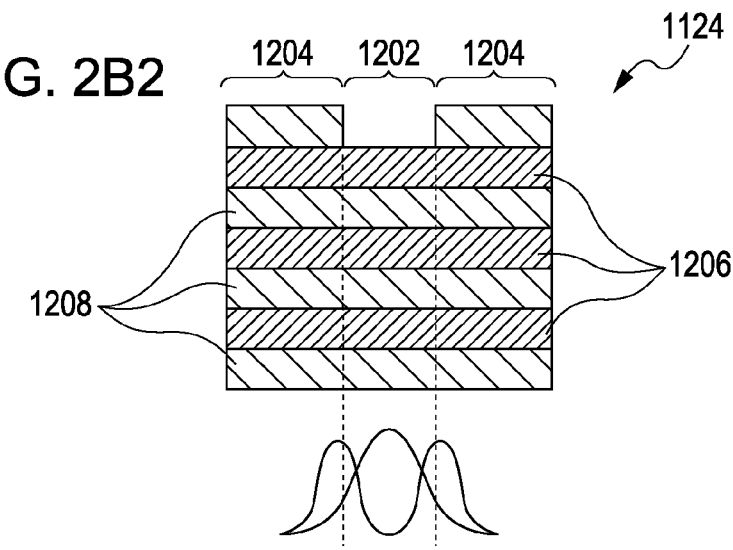

FIG. 3A1
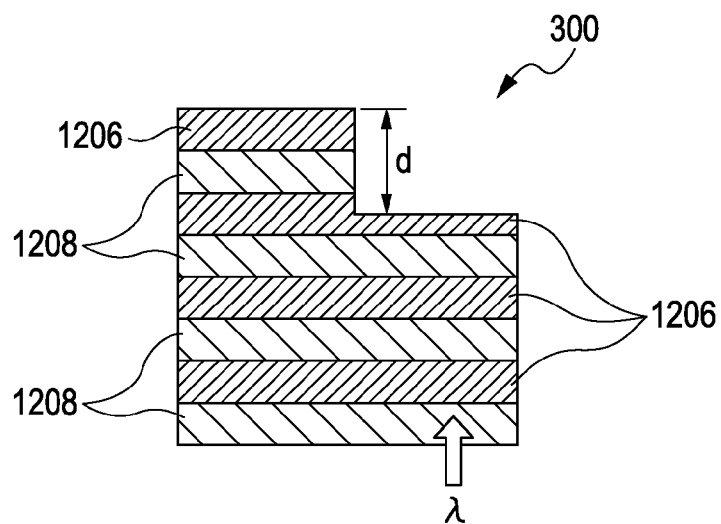
FIG. 3A2
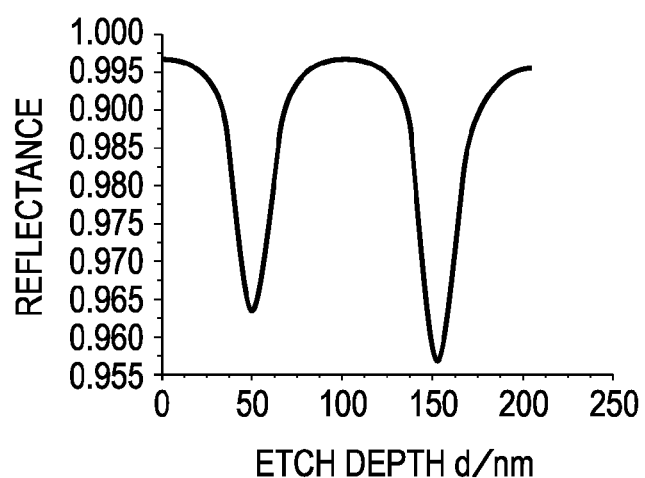
FIG. 3B1
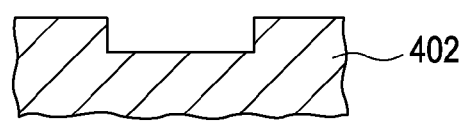
FIG. 3B2
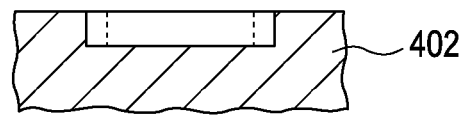

FIG. 4C2 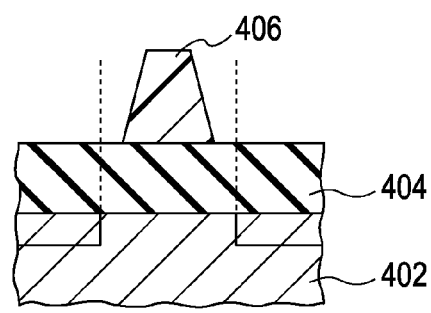

FIG. 4D2 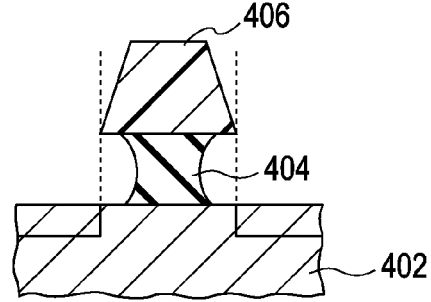

FIG. 5E
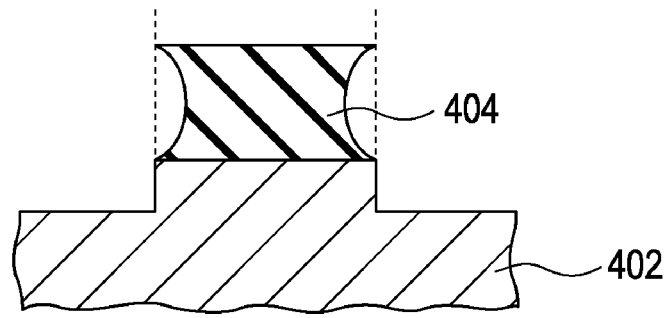
FIG. 5E2
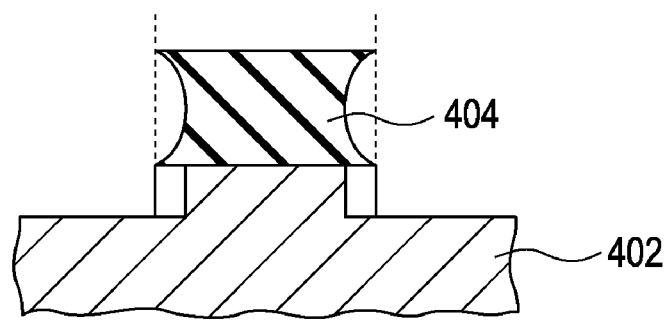
FIG. 5F
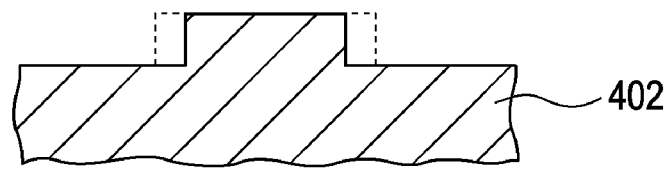

SURFACE-EMITTING LASER AND SURFACE-EMITTING LASER ARRAY

TECHNICAL FIELD

The present invention relates to a surface-emitting laser and a surface-emitting laser array.

BACKGROUND ART

A vertical-cavity surface-emitting laser (VCSEL) is known as one of surface-emitting lasers. In the vertical-cavity surface-emitting laser (hereinafter, referred to as a "VCSEL"), an active region is arranged between two reflectors to form an optical cavity in the direction perpendicular to a substrate surface. The VCSEL emits light in the direction perpendicular to the substrate surface.

For such a VCSEL, a surface relief structure is known as one of methods for controlling a transverse mode.

FIG. 2A is a cross-sectional view of a surface-emitting laser having a surface relief structure in the related art. FIG. 2A illustrates a VCSEL 1100.

As illustrated in FIG. 2A, the VCSEL 1100 includes a lower multilayer reflector 1104, a lower cladding layer 1106, an active layer 1108, an upper cladding layer 1110, an oxidized confinement layer 1112, and an upper multilayer reflector 1114 stacked on a substrate 1102.

To form the oxidized confinement layer 1112 by oxidation from side walls of the layer, the VCSEL 1100 has a mesa structure configured to expose at least the oxidized confinement layer 1112.

The transverse-mode oscillation of the VCSEL 1100 is dominated by the oxidized confinement layer 1112. For example, a fundamental mode 1130 and a higher-order mode 1132 (here, a first-order mode) having light-intensity distributions as illustrated in FIG. 2A are present.

To allow the VCSEL to oscillate selectively in the transverse mode, for example, a protruding surface relief structure 1120 is formed on a surface of the upper multilayer reflector 1114 of the VCSEL.

The upper multilayer reflector has different reflectances in different regions thereof owing to the surface relief structure. It is thus possible to adjust the mirror loss between the transverse modes.

Hence, oscillation can occur selectively in a specific transverse mode.

To allow the VCSEL to oscillate selectively in the fundamental mode 1130, NPL 1 discloses surface relief structures 1122 and 1124 as illustrated in FIGS. 2B1 and 2B2, each of the surface relief structures 1122 and 1124 having a high reflectance in the middle portion compared with a reflectance in a peripheral portion of a light exit region.

The light intensity of the fundamental mode 1130 is concentrated in the middle of the light exit region compared with the higher-order mode 1132.

Thus, in the foregoing structure, the mirror loss of the higher-order mode is higher than that of the fundamental mode, suppressing the oscillation in the higher-order mode.

In NPL 1, two structures as illustrated in FIGS. 2B1 and 2B2 are disclosed as the surface relief structure 1120.

That is, the surface relief structure 1122 (hereinafter, referred to as a "protruding surface relief structure") is a structure in which a peripheral portion 1204 are etched to reduce the reflectance. The surface relief structure 1124 (hereinafter, referred to as a "recessed surface relief structure") is a structure in which a middle portion 1202 is etched to increase the reflectance.

The reason the reflectance of the multilayer reflector is changed by etching is described below. For a multilayer reflector commonly used as a reflector of a VCSEL, the reflectance of the multilayer reflector varies periodically in response to the etch depth when the multilayer reflector is etched. A multilayer reflector includes pairs of high-refractive-index layers 1206 having an optical thickness of $\lambda/4$ and low-refractive-index layers 1208 having an optical thickness of $\lambda/4$ as illustrate in FIG. 3A1. FIG. 3A2 is a graph showing the relationship between the etch depth d and the reflectance of light incident on an etched portion when the multilayer reflector is etched by a depth d as illustrated in FIG. 3A1.

Here, the number of the pairs of the layers of the multilayer reflector is 34 pairs before etching. The high-refractive-index layers 1206 have a refractive index of 3.43. The low-refractive-index layers 1208 have a refractive index of 3.14.

A medium 300 of the etched portion is air and has a refractive index of 1. The incident light has a wavelength $\lambda$ of 680 nm.

As is clear from FIG. 3A2, the refractive index when the multilayer reflector is terminated at the low-refractive-index layer 1208 having an optical thickness of $\lambda/4$ is lower than that in the case where the high-refractive-index layer 1206 having an optical thickness of $\lambda/4$ is further stacked.

Furthermore, the reflectance is lower than that in the case where the low-refractive-index layer 1208 is removed to expose the high-refractive-index layer 1206.

The reflectance is periodically minimized or maximized at etch depths d corresponding to an optical path of $\lambda/2$. For the protruding surface relief structure 1122 illustrated in FIG. 2B1, with respect to the upper multilayer reflector terminated at the high-refractive-index layer 1206 having an optical thickness of $\lambda/4$, the high-refractive-index layer 1206 located in the peripheral portion 1204 is removed to reduce the reflectance of the peripheral portion 1204.

For the recessed surface relief structure 1124 illustrated in FIG. 2B2, with respect to the upper multilayer reflector terminated at the low-refractive-index layer 1208 having an optical thickness of $\lambda/4$, the low-refractive-index layer 1208 located in the middle portion 1202 is removed to increase the reflectance of the middle portion.

By adjusting the size of the etched region in the in-plane direction, a high-reflectance region is arranged in accordance with the high-intensity range of the fundamental mode 1130, and a low-reflectance region is arranged in the peripheral region in accordance with the high-intensity range of the higher-order mode 1132 as illustrated in FIGS. 2B1 and 2B2.

This allows the VCSEL to oscillate selectively only in the fundamental mode 1130.

CITATION LIST

Non Patent Literature

NPL 1 H. J. Unold et al. "Large-Area Single-Mode VCSELs and the Self-Aligned Surface Relief" IEEE Journal on selected topics in quantum electronics, VOL. 7, NO. 2, p. 386, MARCH/APRIL 2001

SUMMARY OF INVENTION

Technical Problem

For the surface relief structure, the important point is the size (area) of the high-reflectance region in the in-plane direction, the high-reflectance region covering a region where light intensity of a desired oscillation mode is high.

That is, if the high-reflectance region is small, the mirror loss for a desired oscillation mode is increased, thus increasing a threshold level. If the high-reflectance region is large, the oscillation of a mode other than a desired oscillation mode is not suppressed.

However, for the surface relief structures 1122 and 1124 of the VCSEL disclosed in NPL 1, there is a possibility of causing variations in the size of the high-reflectance region 1202 of the surface relief with reference to the designed size, depending on the production process.

The possibility will be specifically described by taking a process for etching a semiconductor by general photolithography illustrated in FIGS. 4A to 4D2 as an example.

For example, suppose that a semiconductor 402 having a protruding structure is formed as illustrated in FIG. 4A.

To form the structure, as illustrated in FIG. 4B, a hard mask 404 composed of a dielectric material such as $SiO_2$ is stacked on the semiconductor 402. A resist 406 is applied thereon. The resist 406 is exposed with, for example, a mask aligner in a desired pattern.

The pattern used here has a boundary located along broken lines in FIG. 4B in order to form the structure illustrated in FIG. 4A by etching.

As illustrated in FIG. 4C, after the exposure, the resist 406 is developed to form a resist mask pattern. As illustrated in FIG. 4D, the hard mask 404 is etched using the resist 406 as a mask.

The resist 406 is removed. As illustrated in FIG. 5E, the semiconductor 402 is etched using the hard mask 404 as a mask. Removal of the hard mask 404 affords the protruding structure illustrated in FIG. 4A.

This process includes three steps that cause variations in the area of the pattern formed by etching.

First, in the step of developing the resist, as illustrated in FIG. 4C2, an excess of developing time can result in a reduction the size of the resist pattern to be left.

Second, in the step of etching the hard mask using the patterned resist as a mask, as illustrated in FIG. 4D2, side walls of the hard mask 404 can be etched. In particular, in the case of etching the hard mask 404 having a relatively thick, the side walls are significantly etched.

Third, in the step of etching the semiconductor using the hard mask as a mask, as illustrated in FIG. 5E2, side walls of the projection of the semiconductor 402 can be etched.

In the production process of the VCSEL, a thick hard mask can be needed. In that case, in particular, the etching of the side walls of the hard mask is the biggest problem among the problems described above.

For example, in a red VCSEL including an AlGaAs-based multilayer reflector, the multilayer reflector is required to have a large number of pairs in order to obtain a high reflectance.

To this end, deep etching is needed to form a mesa. In the case of forming the mesa by dry plasma etching, a resist mask does not withstand the etching. It is thus necessary to use a thick hard mask having a thickness of, for example, 0.5 μm.

Furthermore, in the case of employing a self-alignment process in which the VCSEL mesa is centered on the center of the surface relief structure 1120, a thick hard mask having a thickness of, for example, 0.5 μm is needed, in some cases. In this case, variations in the etch length of side walls of the hard mask is about 0.5%.

For the reasons described above, in the case of forming the protruding structure as illustrated in FIG. 4A, the size of the central region is reduced, as illustrated in FIG. 5F. For the same reasons, in the case of forming the recessed structure as illustrated in FIG. 3B1, the size of the central region is increased, as illustrated in FIG. 3B2.

Specific values of the size of the surface relief structure of a VCSEL will be described below.

In order to allow an oxidized confinement-type VCSEL as illustrated in FIG. 2A to oscillate only in the fundamental mode and to suppress the higher-order-mode oscillation, a high-reflectance portion of the surface relief structure may have a diameter described below.

For example, in the case of an oxidized confinement aperture having a diameter of 6 v, in order to oscillate only in the fundamental mode 1130 and to suppress, for example, a first-order-mode oscillation, which is the second easiest to occur, the high-reflectance portion of the surface relief structure 1120 has a diameter of about 3 μm, which is half the diameter of the aperture.

Here, if a surface relief as illustrated in FIG. 2B1 or 2B2 is produced by the foregoing process, the following problems occur.

That is, for the protruding surface relief structure 1122, the area of the high-reflectance region 1202 is reduced. For the recessed surface relief structure 1124, the area of the high-reflectance region 1202 is increased.

For example, with respect to the protruding surface relief structure having a diameter of 3 μm, in the case where variations in the position of each of the boundaries due to the etching of the side walls are within 0.5 μm, variations in the area of the high-reflectance region 1202 are in the range of $(2/3)^2=0.44$ to 1 time from element to element.

This causes significant variations in element characteristics, e.g., laser threshold and the slope efficiency between the output light intensity and the current applied.

The VCSEL is often used as an arrayed device. The variations in characteristics in one array are practically disadvantageous.

Furthermore, the variations in characteristics in one wafer or between wafers cause an increase in the proportion of elements that do not meet specifications, thus reducing the production yield of the elements.

In light of the foregoing problems, the present invention provides a surface-emitting laser including a surface relief structure that is capable of reducing variations in element characteristics, as compared with surface relief structures in the related art, and provides a surface-emitting laser array.

Solution to Problem

The present invention provides a surface-emitting laser and a surface-emitting laser array each having a structure described below.

According to an aspect of the present invention, a surface-emitting laser capable of controlling the transverse mode and having an oscillation wavelength of λ includes, on a substrate, a lower multilayer reflector, an active layer, an upper multilayer reflector, and a surface relief structure provided on the upper multilayer reflector, the surface relief structure including a high-reflectance region in the middle portion of a light exit region, the high-reflectance region having a higher reflectance than a peripheral portion, in which the surface relief structure includes, on the upper multilayer reflector, a region of a first laminate, a region of a second laminate that has a larger optical thickness than the first laminate, and a region of a third laminate that has a larger optical thickness than the first laminate and the second laminate.

According to another aspect of the present invention, a surface-emitting laser array includes the foregoing surface-emitting lasers arranged in an array.

Advantageous Effects of Invention

According to aspects of the present invention, it is possible to provide a surface-emitting laser including a surface relief structure capable of reducing variations in element characteristics, as compared with surface relief structures in the related art, and provides a surface-emitting laser array.

BRIEF DESCRIPTION OF DRAWINGS

FIG. 2A is a cross-sectional view of a surface-emitting laser having a surface relief structure, FIG. 2B1 is a cross-sectional view of a surface-emitting laser having a protruding surface relief structure, and FIG. 2B2 is a cross-sectional view of a surface-emitting laser having a recessed surface relief structure, in the related art.

FIGS. 3A1 to 3B2 are schematic views showing the relationship between the etch depth and the reflectance to illustrate the reason for a change in the reflectance of a multilayer reflector by etching.

FIGS. 4A to 4D2 are schematic views illustrating the reason variations in the size of a high-reflectance region of a surface relief occur depending on a production process in a surface relief structure in the related art.

FIGS. 5E to 5F are schematic views illustrating the reason variations in the size of a high-reflectance region of a surface relief occur depending on a production process in a surface relief structure in the related art.

DESCRIPTION OF EMBODIMENTS

As described in Section "Technical Problem", because of adverse phenomena occurring in the process, e.g., the etching of the side walls of the hard mask, the area of the high-reflectance region in the protruding relief structure is reduced, and the area of the high-reflectance region in the recessed relief structure is increased.

Figure 1A:
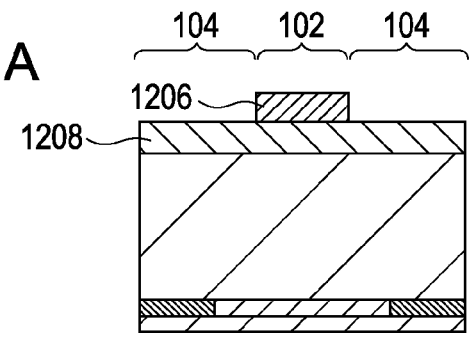
FIGS. 1A to 1D are schematic views illustrating surface relief structures of surface-emitting lasers according to an embodiment of the present invention.
Figure 1B:
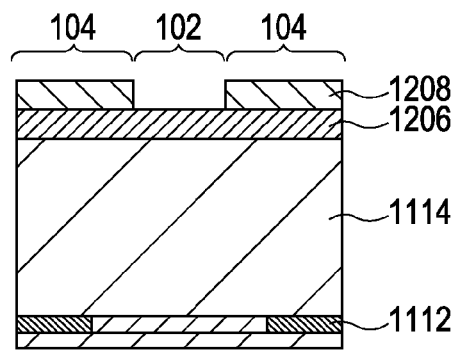

The problems are unavoidable in surface relief structures in which a high-reflectance region 102 and a low-reflectance region 104 are formed in regions having the same surface heights (i.e., regions having the same distances from the bottom of an upper multilayer reflector) in the related art as illustrated in FIGS. 1A and 1B.

Figure 1C:
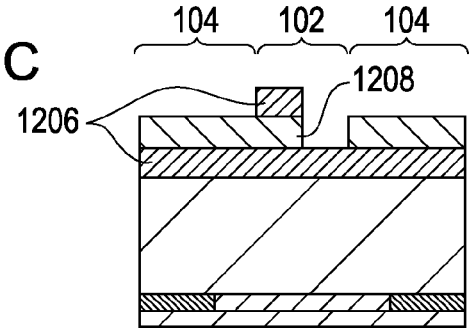
Figure 1D:
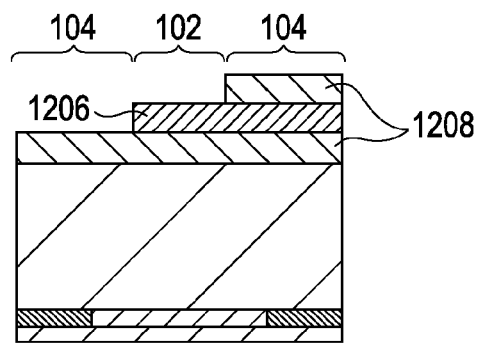
Figure 4A:
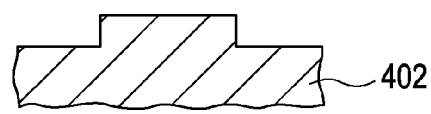
Figure 4B:
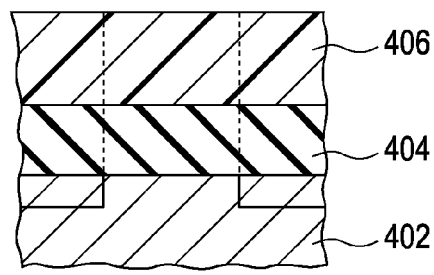
Figure 4C:
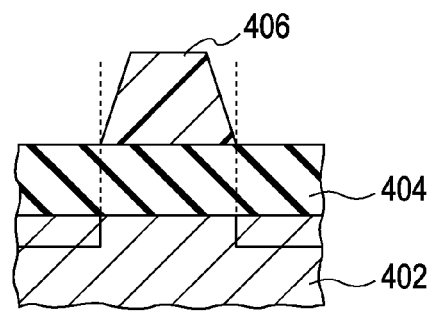
Figure 4D:
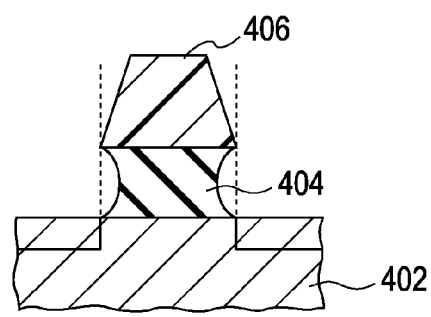

According to aspects of the present invention, for example, as illustrated in FIGS. 1C and 1D, one or both of the high-reflectance region 102 and the low-reflectance region 104 are divided. So, the surface relief structures are each formed of a plurality of laminates having different optical thicknesses.

The arrangement of the regions offsets the increase and decrease in the size of the high-reflectance regions formed in the middle portions due to phenomena occurring in the process, thereby suppressing variations in the area of the high-reflectance region.

Details will be apparent from the description of embodiments described below.

EMBODIMENTS

Embodiments of the present invention will be described below.

First Embodiment

A configuration example of a vertical-cavity surface-emitting laser (VCSEL) according to a first embodiment of the present invention will be described below with reference to FIGS. 6A to 6C, in which the VCSEL includes, on a substrate, a lower multilayer reflector, an active layer, and an upper multilayer reflector, is capable of controlling the transverse mode, and has an oscillation wavelength of $\lambda$.

Figure 6A:
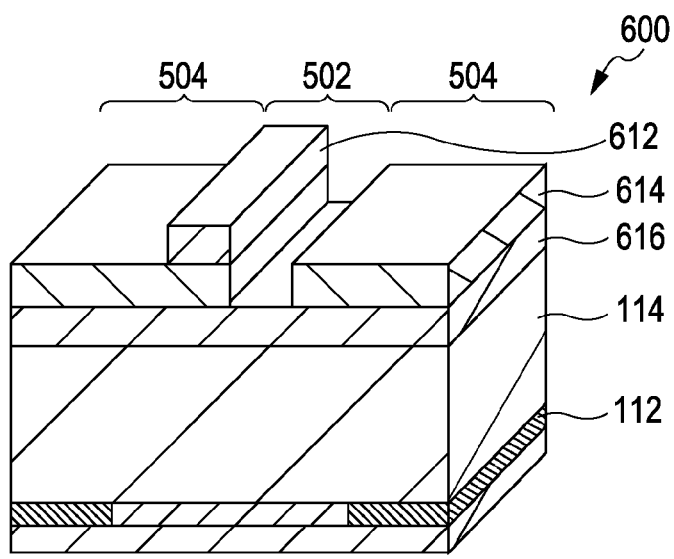
FIGS. 6A to 6C are schematic views illustrating a surface-emitting laser including a surface relief structure corresponding to that illustrated in FIG. 1C according to a first embodiment of the present invention.

FIG. 6A is a perspective cross-sectional view of an oxidized confinement-type VCSEL 600 having a surface relief structure corresponding to that illustrated in FIG. 1C.

A portion located below an oxidized confinement layer 112 is the same as that illustrated in FIG. 2A according to the related art and is thus omitted. FIG. 6B is a plane view of the VCSEL 600 viewed from a light exit surface.

Figure 6B:
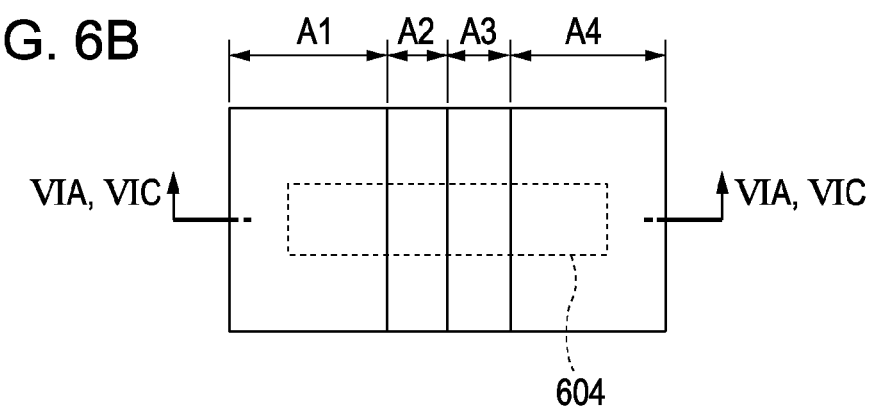
Figure 6C:
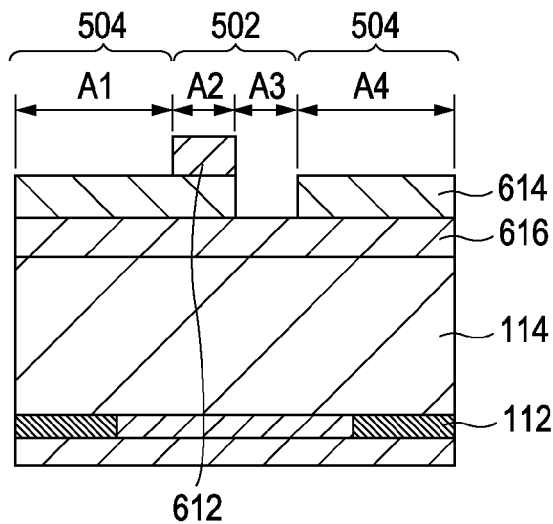

FIG. 6C is a cross-sectional view of the VCSEL 600 viewed from a side.

Each of the cross sections illustrated in FIGS. 6A and 6C is a cross section taken along line VIA-VIA or VIC-VIC in FIG. 6B.

FIG. 6C illustrates a surface relief structure which includes a third semiconductor layer 616, a second semiconductor layer 614, and a first semiconductor layer 612 stacked on an upper multilayer reflector 114 and in which a high-reflectance region is formed in the middle portion of a light exit region and has a higher reflectance than the peripheral portion. As illustrated in FIG. 6C, the surface relief structure includes four regions A1, A2, A3, and A4.

In the region A2, the semiconductor layers are not etched. In the regions A1 and A4, the first semiconductor layer 612 is etched. In the region A3, the first semiconductor layer 612 and the second semiconductor layer 614 are etched.

Here, the first semiconductor layer and the third semiconductor layer have higher refractive indices than the second semiconductor layer.

The uppermost layer of the upper multilayer reflector 114 has a lower refractive index than the third semiconductor layer and is composed of, for example, a material the same as that for the second semiconductor layer.

Specifically, for example, the first semiconductor layer is composed of GaAs. For example, the second semiconductor layer is composed of $Al_{0.9}GaAs$. For example, the third semiconductor layer is composed of $Al_{0.5}GaAs$.

Each of the three layers has an optical thickness of $\lambda/4$ where $\lambda$ represents the oscillation wavelength of the VCSEL.

A region surrounded by a broken line 604 in FIG. 6B indicates a current confinement aperture of the oxidized confinement layer.

The regions (regions A2 and A3) located closer to the center serve as a high-reflectance region 502, and the regions (regions A1 and A4) located in peripheral portions serve as low-reflectance regions 504, when viewed in the direction along the long side of the rectangular aperture (in the lateral direction in FIG. 6B). This results in the suppression of higher-order mode oscillation.

Next, a method for producing the surface relief structure of the VCSEL 600 will be described, and the effect of this embodiment will also be described.

FIGS. 7A to 7G illustrate the method for producing the surface relief structure.

Figure 7A:
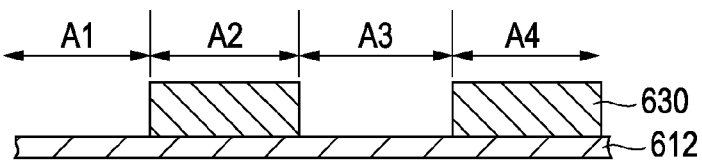
FIGS. 7A to 7G are schematic views illustrating a method for producing the surface relief structure corresponding to that illustrated in FIG. 1C according to the first embodiment of the present invention.

A hard mask and a resist are stacked on the first semiconductor layer 612. As illustrated in FIG. 7A, the resist is exposed and developed, and the hard mask is etched, in such a manner that the resist and the hard mask are left on portions as masks, the portions corresponding to regions to be finally formed into the regions A2 and A4.

Reference numeral 630 in FIG. 7A denotes the patterned hard mask.

Figure 7B:
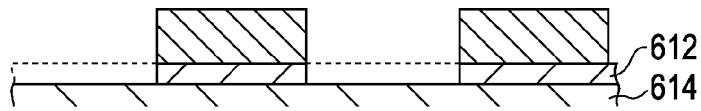

As illustrated in FIG. 7B, after the resist is removed, the first semiconductor layer 612 is etched using the hard mask as a mask.

Here, for the foregoing reasons (for example, in the case where the side walls of the hard mask are significantly etched), each boundary can be shifted in the direction indicated by arrows in FIG. 7A, thereby leading to a reduction in the area of the region A2 from the design value.

For the same reasons, the area of the region A3 can be increased from the design value.

However, in the figure, the direction of the shift of the boundary between the regions A1 and A2 is the same as that of the boundary between the regions A3 and A4. Thus, the amount of change in the total area of the regions A2 and A3 is smaller than each of the amount of the reduction in area and the amount of the increase in area.

Figure 7C:
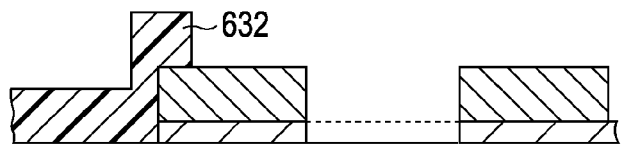

Next, a resist is applied so as to cover the region A1 as illustrated in FIG. 7C, forming a resist mask 632. A hard mask may be combined.

Figure 7D:
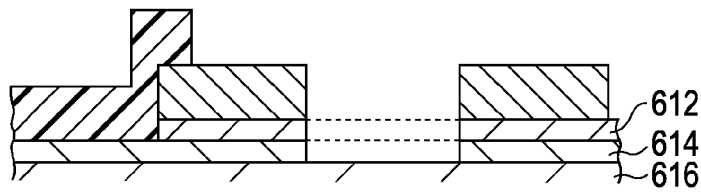

As illustrated in FIG. 7D, the second semiconductor layer 614 in the region A3 is etched using the patterned masks 630 and 632 as masks.

Figure 7E:
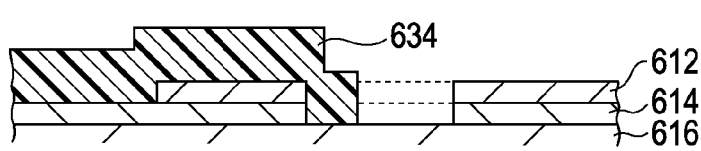

Then the resist masks are removed. A resist is applied. As illustrated in FIG. 7E, a resist mask 634 is patterned so as to cover the region A2.

Figure 7F:

As illustrated in FIG. 7F, the first semiconductor layer 612 in the region A4 is etched. Here, an etchant, with which the first semiconductor layer 612 is etched and the third semiconductor layer 616 is slightly etched or is not etched at all, is used. Furthermore, the second semiconductor layer 614 may not be etched.

Figure 7G:
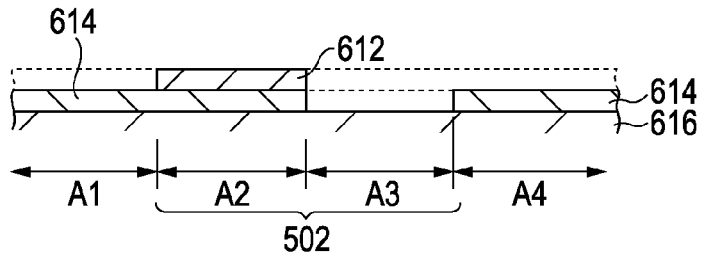

As illustrated in FIG. 7G, removal of the resist mask 634 affords the surface relief structure.

With respect to the semiconductor layers 616, 614, and 612 formed on the upper multilayer reflector 114 in FIG. 6C, the semiconductor layer in the region A3 is referred to as a "first laminate". The semiconductor layers in the regions A1 and A4 are referred to as "second laminates". The semiconductor layers in the region A2 are referred to as a "third laminate".

The first laminate includes the semiconductor layer 616 in the region A3. The second laminates include the semiconductor layers 616 and 614 in the regions A1 and A4. The third laminate includes the semiconductor layers 616, 614, and 612 in the region A2. The optical thickness of each of the second laminates is larger than that of the first laminate and is smaller than that of the third laminate.

The region A3 is in contact with the region A4. The region A2 is in contact with the region A1.

That is, the second laminates are adjacent to the first laminate and the third laminate.

In this surface relief structure, the regions A2 and A3 serve as the high-reflectance region 502. The regions A1 and A4 serve as the low-reflectance regions 504.

That is, the reflectance (R1) of the first laminate and the upper multilayer reflector for normal incident light and the reflectance (R3) of the third laminate and the upper multilayer reflector for normal incident light are higher than the reflectance (R2) of the second laminates and the upper multilayer reflector for normal incident light.

As described above, in this embodiment, the high-reflectance region 502 includes the region A2, which is not etched compared with the low-reflectance region A1, and the region A3, which is further etched compared with the low-reflectance region A1.

As described above, the region A3 is adjacent to the region A4. The region A2 is adjacent to the region A1. Because of the foregoing phenomena such as the etching of the side walls in the process, the area of the region A2 is reduced, and the area of the region A3 is increased. This offsets the variations in the size of the first laminate and the third laminate constituting the high-reflectance region.

It is thus possible to suppress the variations in the area of the high-reflectance region 502 of the surface relief structure with reference to the design value, as compared with the structures in the related art (e.g., see FIGS. 1A and 1B).

Figure 8:
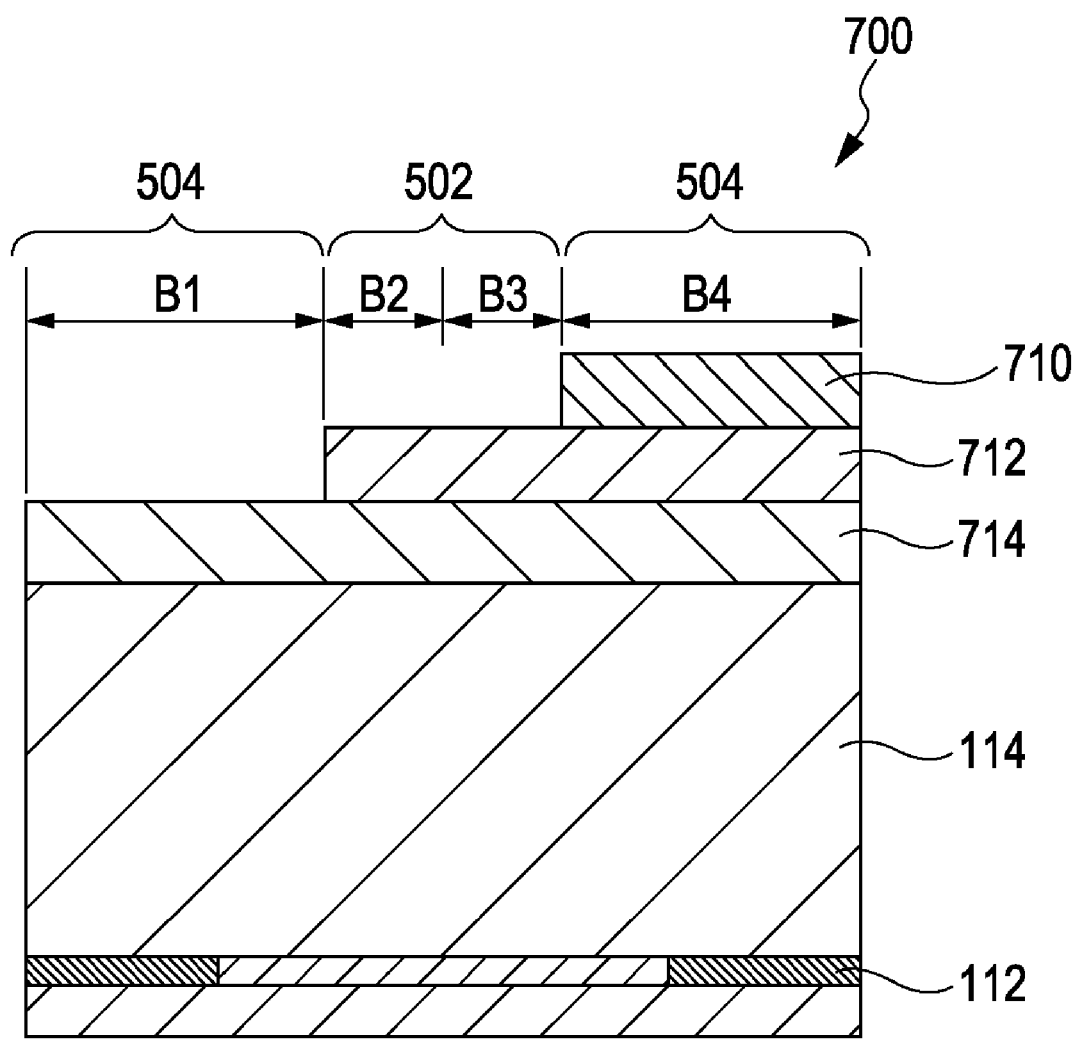
FIG. 8 is a schematic view illustrating a surface-emitting laser including a surface relief structure corresponding to that illustrated in FIG. 1D according to the first embodiment of the present invention.

FIG. 8 illustrates a VCSEL 700 having the relief structure illustrated in FIG. 1D. FIGS. 9A to 9G illustrate a method for producing the VCSEL 700.

The VCSEL 700 illustrated in FIG. 8 is the same as the VCSEL 600 illustrated in FIGS. 6A to 6C, except for the upper multilayer reflector and the surface relief structure.

As illustrated in FIG. 8, a sixth semiconductor layer 714, a fifth semiconductor layer 712, a fourth semiconductor layer 710 are stacked on the upper multilayer reflector 114.

As illustrated in FIG. 8, the surface relief structure of the VCSEL 700 includes four regions B1, B2, B3, and B4.

In the region B4, the semiconductor layers are not etched. In the regions B2 and B3, the fourth semiconductor layer 710 is etched. In the region B1, the fourth semiconductor layer 710 and the fifth semiconductor layer 712 are etched.

Here, the fifth semiconductor layer 712 has a higher refractive index than the sixth semiconductor layer 714.

The refractive index of the fourth semiconductor layer 710 may be higher or lower than that of the fifth semiconductor layer.

The uppermost layer of the upper multilayer reflector has a higher refractive index than the sixth semiconductor layer and is composed of, for example, a material the same as that for the fifth semiconductor layer. Specifically, for example, the fourth semiconductor layer is composed of GaAs. For example, the fifth semiconductor layer is composed of $Al_{0.5}GaAs$. For example, the sixth active layer is composed of $Al_{0.9}GaAs$.

Each of the three layers has an optical thickness of λ/4 where λ represents the oscillation wavelength of the VCSEL.

Similarly to the case illustrated in FIGS. 6A to 6C, the regions (regions B2 and B3) located closer to the center of the current confinement aperture of the oxidized confinement layer 112 serve as a high-reflectance region 502, and the regions (regions B1 and B4) located in peripheral portions serve as low-reflectance regions 504. This results in the suppression of higher-order mode oscillation.

With respect to the semiconductor layers 714, 712, and 710 formed on the upper multilayer reflector 114 in FIG. 8, the semiconductor layer in the region B1 is referred to as a "first laminate". The semiconductor layers in the regions B2 and B3 are referred to as a "second laminate". The semiconductor layers in the region B4 are referred to as a "third laminate".

The surface relief structure illustrated in FIG. 8 is compared with the surface relief structure illustrated in FIGS. 1C and 6. The regions (regions B2 and B3) located closer to the center have higher reflectances than the peripheral regions (regions B1 and B4).

That is, a common point is that the reflectance (R1) of the first laminate and the upper multilayer reflector for normal incident light and the reflectance (R3) of the third laminate and the upper multilayer reflector for normal incident light are higher than the reflectance (R2) of the second laminates and the upper multilayer reflector for normal incident light.

Another common point is that the optical thickness of the second laminate is larger than that of the first laminate and is smaller than that of the third laminate.

Another common point is that the second laminate is adjacent to the first and third laminates. However, in the surface relief structure illustrated in FIG. 8, the second laminate is located in the middle portion of the light exit region, and the first and third laminates are located in the peripheral portion. This point is different from the surface relief structure illustrated in FIGS. 1C and 6A to 6C.

FIGS. 9A to 9G illustrate the method for producing the surface relief structure.

Figure 9A:
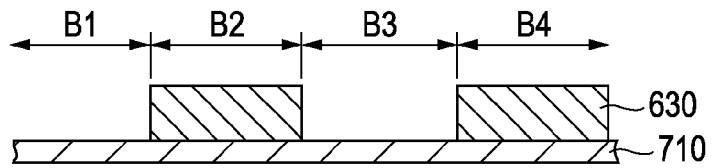
FIGS. 9A to 9G are schematic views illustrating a method for producing the surface relief structure corresponding to that illustrated in FIG. 1D according to the first embodiment of the present invention.

A hard mask and a resist are stacked on the fourth semiconductor layer 710. As illustrated in FIG. 9A, the resist is exposed and developed, and the hard mask is etched, in such a manner that the resist and the hard mask are left on portions as masks, the portions corresponding to regions to be finally formed into the regions B2 and B4.

Reference numeral 630 in FIG. 9A denotes the patterned hard mask.

Figure 9B:
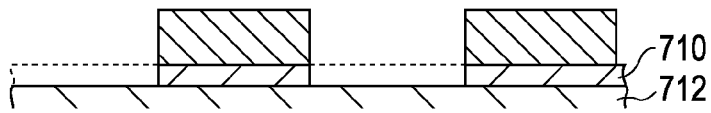

As illustrated in FIG. 9B, after the resist is removed, the fourth semiconductor layer 710 is etched using the hard mask as a mask.

Here, for the foregoing reasons (for example, in the case where the side walls of the hard mask are significantly etched), each boundary can be shifted in the direction indicated by arrows in the figure, thereby leading to a reduction in the area of the region B2. For the same reasons, the area of the region B3 can be increased from the design value.

However, in the figure, the direction of the shift of the boundary between the regions B1 and B2 is the same as that of the boundary between the regions B3 and B4.

Thus, the amount of change in the total area of the regions B2 and B3 is smaller than each of the amount of the reduction in area and the amount of the increase in area.

Figure 9C:
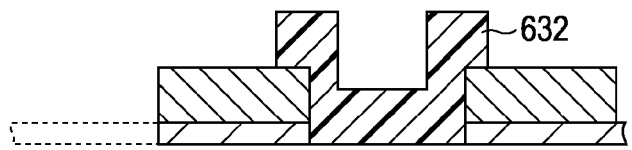

Next, a resist is applied so as to cover the region B3 as illustrated in FIG. 9C, forming a resist mask 632. A hard mask may be combined.

Figure 9D:
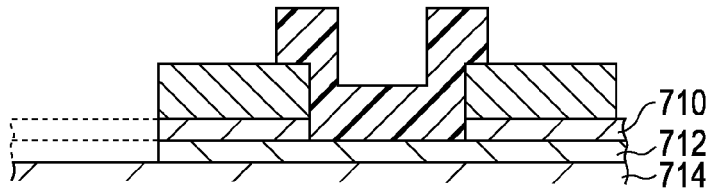

As illustrated in FIG. 9D, the fifth semiconductor layer 712 in the region B1 is etched using the patterned masks 630 and 632 as masks.

Figure 9E:
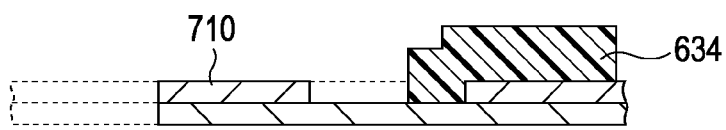

Then the resist masks are removed. A resist is applied. As illustrated in FIG. 9E, the resist mask 634 is patterned so as to cover the region B4.

Figure 9F:
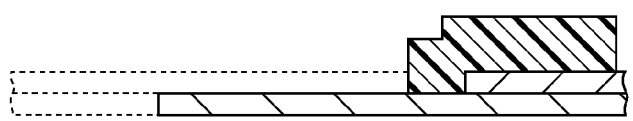

As illustrated in FIG. 9F, the fourth semiconductor layer 710 in the region B2 is etched.

Here, an etchant, with which the fourth semiconductor layer 710 is etched and the sixth semiconductor layer 714 is slightly etched or is not etched at all, is used. Furthermore, the fifth semiconductor layer 712 may not be etched.

Figure 9G:
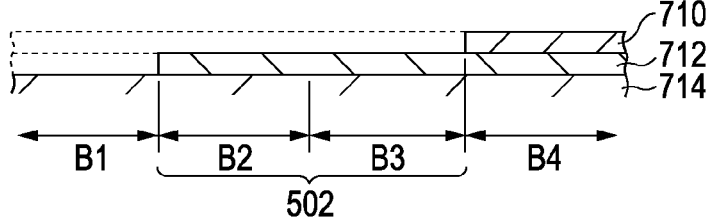

As illustrated in FIG. 9G, removal of the resist mask 634 affords the surface relief structure.

With respect to the layer configuration of the surface relief according to this embodiment, the first semiconductor layer 612, the second semiconductor layer 614, and the third semiconductor layer 616 illustrated in FIGS. 6A to 6C and the fourth semiconductor layer 710, the fifth semiconductor layer 712, and the sixth semiconductor layer 714 illustrated in FIG. 8 each have a thickness of λ/4.

However, the thickness may not be strictly λ/4 but may be adjusted within the range of the present invention.

For example, in the case where each layer has an optical thickness of λ/4 in FIGS. 6A to 6C, the reflectance (R3) of the third laminate, which is located in the high-reflectance region 502, and the upper multilayer reflector for normal incident light is slightly higher than the reflectance (R1) of the first laminate and the upper multilayer reflector for normal incident light.

This is because the section of the third laminate and the upper multilayer reflector functions as a reflector whose number of layers is larger than the section of the first laminate and the upper multilayer reflector by a pair of layers.

Thus, the difference in optical thickness between the region of the first laminate and the region of the third laminate is set to an optical thickness of more than λ/4, and the optical thickness of the first semiconductor layer 612 is slightly shifted from λ/4, thereby equalizing the reflectance (R1) with the reflectance (R3).

Similarly, in the surface relief structure illustrated in FIG. 8, for the case where each of the layers has an optical thickness of λ/4, the reflectance (R1) of the first laminate and the upper multilayer reflector for normal incident light is lower than the reflectance (R3) of the third laminate and the upper multilayer reflector for normal incident light.

The reflectances of the low-reflectance regions 504 may not necessarily be equal.

However, if the reflectances are equalized, for example, the optical thickness of the sixth semiconductor layer is reduced to a value less than λ/4. The optical thickness of the fifth semiconductor layer is increased to a value more than λ/4. The sum of the values is set to λ/2, thereby equalizing the reflectance (R1) with the reflectance (R3).

Second Embodiment

In a second embodiment, a surface relief structure according to aspects of the present invention is two-dimensionally applied in the direction of a substrate surface.

In the first embodiment, the surface relief structure is one-dimensionally arranged. Although the variations in the area of the high-reflectance region attributed to the variations in the position of each of the boundaries in the process are suppressed compared with the related art, the barycentric position of the high-reflectance region can be shifted horizontally.

In contrast, the two-dimensional surface relief structure as illustrated in the second embodiment suppresses the change in barycentric position.

Figure 10A:
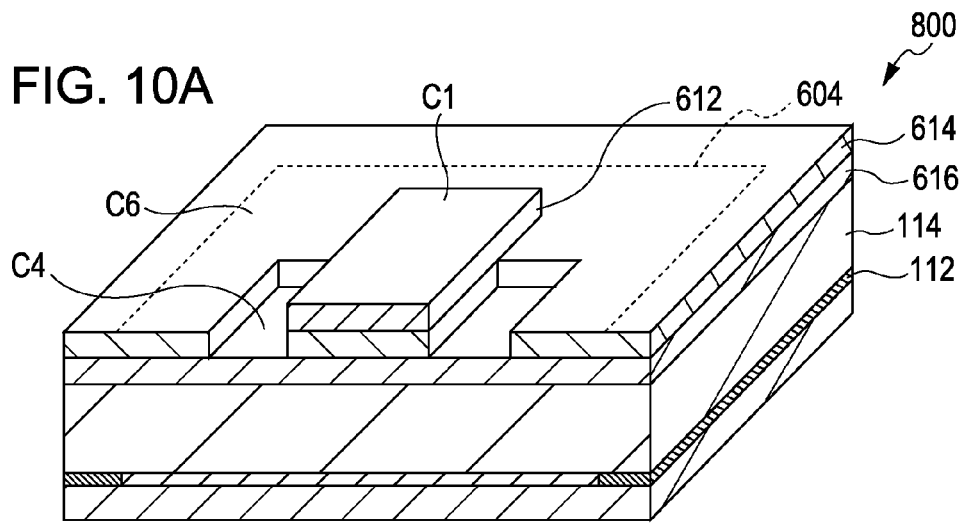
FIGS. 10A to 10C are schematic views illustrating a surface-emitting laser including a surface relief structure according to a second embodiment of the present invention.
Figure 10B:
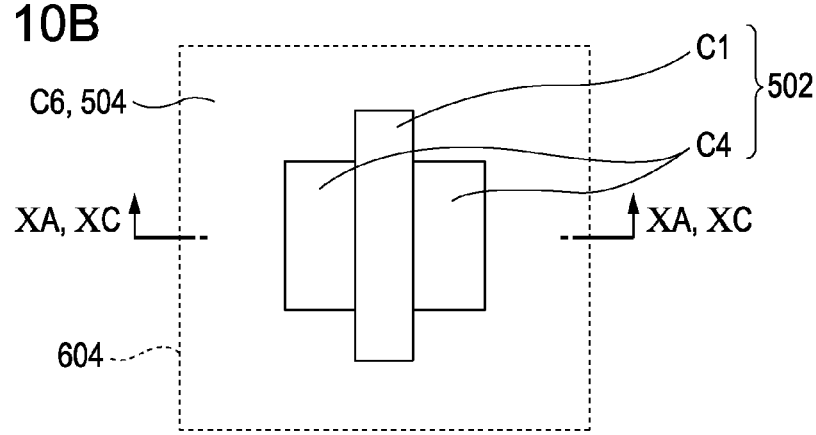
Figure 10C:
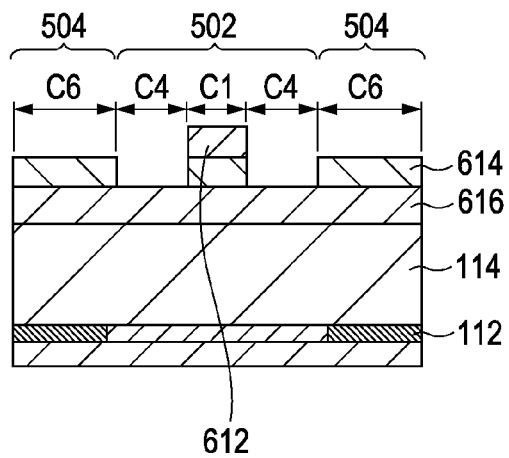

A VCSEL 800 according to the second embodiment is illustrated in FIGS. 10A, 10B, and 10C.

FIG. 10A is a perspective cross-sectional view of the VCSEL 800 having a surface relief structure formed by two-dimensionally applying the structure illustrated in FIG. 1C.

A portion located below the oxidized confinement layer 112 is the same as that illustrated in FIG. 2A according to the related art and is thus omitted.

FIG. 10B is a plane view of the VCSEL 800 viewed from a light exit surface. FIG. 10C is a cross-sectional view of the VCSEL 800 viewed from a side.

Each of the cross sections illustrated in FIGS. 10A and 10C is a cross section taken along line XA-XA or XC-XC if FIG. 10B.

For the surface-emitting laser (VCSEL) 800 according to the second embodiment, for example, a wafer having the same structure, illustrated in FIGS. 6A to 6C, used in the first embodiment may be used.

As illustrated in FIG. 10C, the third semiconductor layer 616, the second semiconductor layer 614, and the first semiconductor layer 612 are staked on the upper multilayer reflector 114.

As illustrated in FIG. 10A, the surface relief structure includes three regions C1, C4, and C6.

With respect to the semiconductor layers 616, 614, and 612 formed on the upper multilayer reflector 114 in FIG. 10A, the semiconductor layer in the region C4 is referred to as a "first laminate". The semiconductor layers in the region C6 are referred to as "second laminate". The semiconductor layers in the region C1 are referred to as a "third laminate".

The first laminate includes the semiconductor layer 616 in the region C4. The second laminates include the semiconductor layers 616 and 614 in the region C6. The third laminate includes the semiconductor layers 616, 614, and 612 in the region C1.

Thus, the optical thickness of the second laminate is larger than that of the first laminate and is smaller than that of the third laminate.

Here, the first semiconductor layer and the third semiconductor layer have higher refractive indices than the second semiconductor layer. The uppermost layer of the upper multilayer reflector 114 has a lower refractive index than the third semiconductor layer and is composed of, for example, a material the same as that for the second semiconductor layer.

Specifically, for example, the first semiconductor layer is composed of GaAs. For example, the second semiconductor layer is composed of $Al_{0.9}GaAs$. For example, the third semiconductor layer is composed of $Al_{0.5}GaAs$.

Each of the three layers has an optical thickness of $\lambda/4$ where $\lambda$ represents the oscillation wavelength of the VCSEL.

A region surrounded by a broken line 604 in FIGS. 10A and 10B indicates a current confinement aperture of the oxidized confinement layer. This current confinement structure is formed by, for example, oxidation of a high-Al-content composition layer from side walls in high-temperature steam.

The regions (regions C1 and C4) located closer to the center of the aperture serve as a high-reflectance region 502, and the region (region C6) located in peripheral portion serve as low-reflectance regions 504. This results in the suppression of higher-order mode oscillation.

Next, a method for producing the surface relief structure of a VCSEL 800 will be described, and the effect of this embodiment will also be described.

FIGS. 11A to 11D illustrate the method for producing the surface relief structure and schematic drawings of the surface relief structure when viewed from the outgoing light side.

Fundamentally, the production method is the same as in the first embodiment. For the sake of simplicity, in FIGS. 11A to 11D, the shapes of the resist and the hard mask are omitted, and the contour of each region is indicated by continuous lines.

Figure 11A:
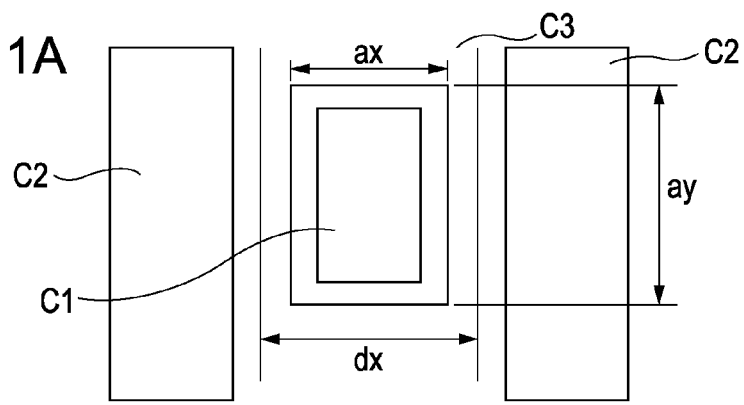
FIGS. 11A to 11D are schematic views illustrating a method for producing the surface relief structure according to the second embodiment of the present invention.

A hard mask and a resist are stacked on the first semiconductor layer 612. As illustrated in FIG. 11A, a mask pattern is formed on the regions C1 and C2. After the resist is removed, the first semiconductor layer 612 in the region C3, which is not covered with the mask, is etched.

The region C1 is located between the two regions C2. The regions C2 are finally formed into part of the region C6. The region C3 is finally formed into the region C4 or C6.

Here, the regions C1, C2, and C3 correspond to the regions A2, A4, and A3, respectively, illustrated in FIGS. 7A and 7B.

Figure 11B:
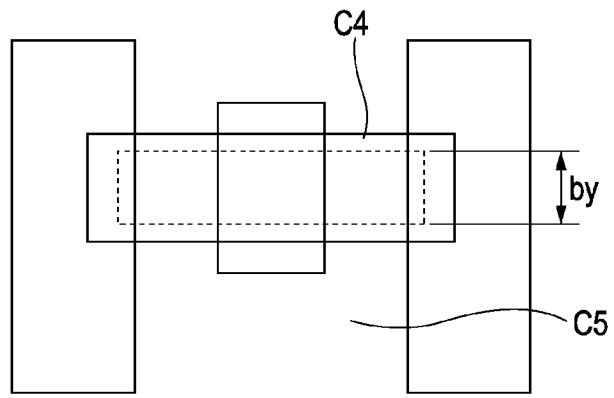

Next, as illustrated in FIG. 11B, a mask is formed so as to cover at least a region C5 and have an opening at a position corresponding to at least the region C4.

Here, the regions C5 and C4 are regions obtained by partitioning the region C3. The opening of this mask overlaps part of each of the regions C1 and C2.

The second semiconductor layer 614 in the region C4 is etched with this mask and the mask formed in FIG. 11A.

Here, the regions C1, C2, C4, and C5 correspond to the regions A2, A4, A3, and A1, respectively, illustrated in FIGS. 7C and 7D.

For the case of forming a groove configured to expose the side wall of the high-Al-content layer in order to form the current confinement structure by oxidation, if the first semiconductor layer and the second semiconductor layer are etched together with the region C4, it is possible to perform a self-alignment process in which the groove and the surface relief can be completely aligned.

Figure 11C:
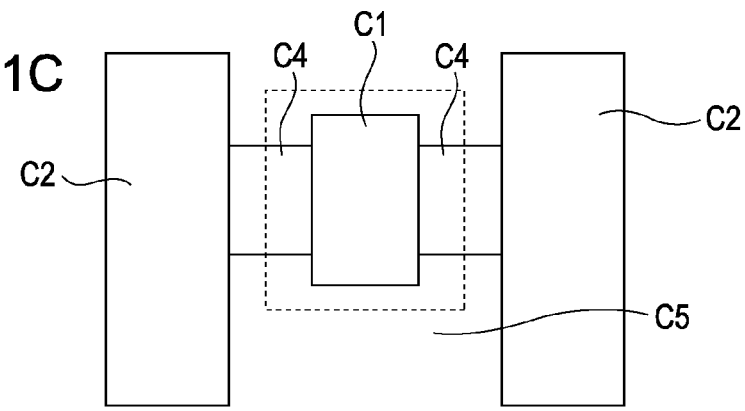

Next, all the masks are removed. As illustrated in FIG. 11C, a mask that covers the region C1 (region surrounded by a broken line in the figure) is formed.

The first semiconductor layer 612 in the region C2 is etched with the mask.

Here, an etchant, with which the first semiconductor layer is selectively etched and with which the second semiconductor layer 614 and the third semiconductor layer 616 are slightly etched or are not etched at all, is used.

Figure 11D:
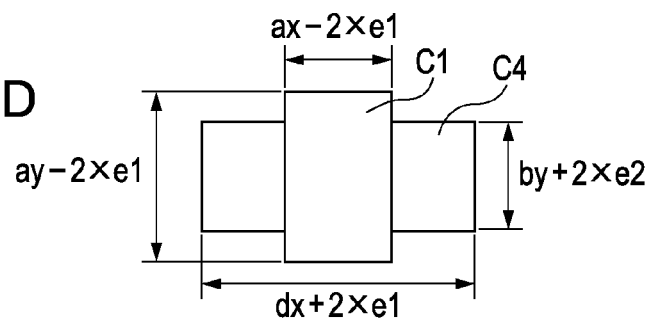

Then removal of the mask completes the surface relief structure as illustrated in FIG. 11D.

A region defined by a combination of the regions C2 and C5 is referred to as a "region C6". The regions C1 and C4 serve as a high-reflectance region. The region C6 serves as a low-reflectance region.

Next, tolerance to variations of the surface relief structure will be discussed using specific values.

With respect to the designed size (a broken line in the figure) of the mask formed in the regions C1 and C2 illustrated in FIG. 11A, let the size of the region C1 in the transverse direction be ax, let the size of the region C1 in the longitudinal direction be ay, and let the distance between the two regions C2 be dx.

An actually etched region is widened by, for example, the etching of side walls of the mask (solid lines in the figure indicate actual boundaries).

Here, let the amount of side wall etched be e1. In this case, for example, the size of the region C1 is expressed as $(ax-2 \times e1) \times (ay-2 \times e1)$.

The mask having an opening formed in FIG. 11B and an etching region when the mask is used will be described below.

Let the designed size of the opening in the longitudinal direction (that is, the size of the region C4 in the longitudinal direction) be by. Similarly, the region C4 can be widened in the actual production process.

Here, let the amount of side wall etched be e2. In this case, the size of each of the two regions C4 is expressed as by +2×e2.

Thus, the size of the high-reflectance region 502 of the surface relief structure is illustrated in FIG. 11D. The area S is expressed as:

$$S=(ax-2\times e1)\times(ay-2\times e1)+((dx+2\times e1)-(ax-2\times e1))\times(by+2\times e2).$$

Specifically, for example, ax=2, ay=4.5, dx=3, and by=2.5, 0≦e1≦0.5, and 0≦e2≦0.5. In the case where no variation in the position of each of the boundaries, i.e., in the case where the actual values are identical to the designed values (that is, e1=e2=0), S=11.5.

Furthermore, when e1 and e2 are independently changed within the range above, 11 (e1=0.5, e2=0)≦S≦14 (e1=e2=0.5).

The maximum/minimum value of the area S, which is used as an indicator of the variation range, is calculated to be 14/11=1.27.

For comparison, with respect to the surface relief structure in the related art, variations e3 in the following cases are in the range of 0 to 0.5, which is the same range described above.

In the case of the protruding relief structure illustrated in FIG. 2B1 of the related art, the size of the middle region, which is the high-reflectance portion, is reduced by, for example, the etching of the side walls.

For example, if the middle region is designed as a square with a side of $\sqrt{14}=3.74$, the area S of the middle region varies in the range of 7.5 to 14.

If the middle region is designed as a circle (in the case of a circle, the variations in the area S are minimized) having a radius of $\sqrt{(14/\pi)}=2.11$, the area S varies in the range of 8.2 to 14. In this case, the maximum/minimum value of the area S is calculated to be 1.71.

In the case of the recessed relief structure illustrated in FIG. 2B2 of the related art, the size of the middle region, which is a high-reflectance portion, is increased by, for example, the etching of the side walls.

For example, if the middle region is designed as a square with a side of $\sqrt{11}=3.3$, the area S of the middle region varies in the range of 11 to 18.6.

If the middle region is designed as a circle (in the case of a circle, the variations in the area S are minimized) having a radius of $\sqrt{(11/\pi)}=1.87$, the area S varies in the range of 11 to 17.7. The maximum/minimum value of the area S is calculated to be 1.61.

Therefore, in this embodiment, it is possible to suppress the variations in the area of the high-reflectance region compared with the surface relief structure of the related art.

The reason for this is as follows: In this embodiment, the high-reflectance region 502 includes the region C1, which is not etched compared with the low-reflectance region C6, and the region C4, which is further etched compared with the low-reflectance region.

Each of the third laminate in the region C1 and the first laminate in the region C4 is partially adjacent to the second laminate in the region C6, which is the low-reflectance region.

For example, because of the etching of the side walls, the boundary between the third laminate and the second laminate is shifted to the third laminate side, and the boundary between the first laminate and the second laminate is shifted to the second laminate side.

Thus, in the high-reflectance region, the area of the region C1 is decreased, and the area of the region C4 is increased. That is, the decrease in area is offset by the increase in area.

Therefore, the total area variations of the high-reflectance region are suppressed compared with the related art.

Other Embodiments

Figure 12A:
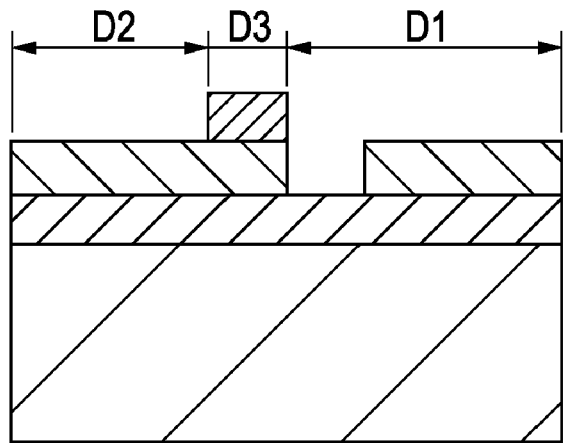
FIGS. 12A and 12B are schematic views illustrating surface relief structures according to other embodiments of the present invention.
Figure 12B:
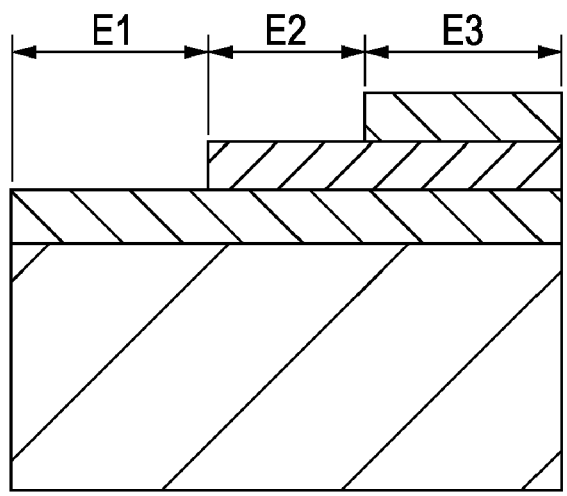

To illustrate other embodiments, regions of surface relief structures are defined as illustrated in FIGS. 12A and 12B.

For a surface relief formed using the same wafer as in FIGS. 6A to 6C, a region that is not etched is referred to as a "region D3", a region where the first semiconductor layer 612 is etched is referred to as a "region D2", and a region where the first semiconductor layer 612 and the second semiconductor layer 614 are etched is referred to as a "region D1".

That is, in the region D3, the third laminate is formed on the upper multilayer reflector. In the region D2, the second laminate is formed on the upper multilayer reflector. In the region D1, the first laminate is formed on the upper multilayer reflector.

Furthermore, For a surface relief formed using the same wafer as in FIG. 8, a region that is not etched is referred to as a "region E3", a region where the fourth semiconductor layer 710 is etched is referred to as a "region E2", and a region where the fourth semiconductor layer 710 and the fifth semiconductor layer 712 are etched is referred to as a "region E1".

That is, in the region E3, the third laminate is formed on the upper multilayer reflector. In the region E2, the second laminate is formed on the upper multilayer reflector. In the region E1, the first laminate is formed on the upper multilayer reflector.

The regions D1 and D3 serve as high-reflectance regions. The region D2 serves as a low-reflectance region.

The region E2 serves as a high-reflectance region. The regions E1 and E3 serve as low-reflectance region.

In the first and second embodiments, for the sake of simplicity, the boundaries in each of the surface relief structures are indicated by linear lines.

Figure 13A:
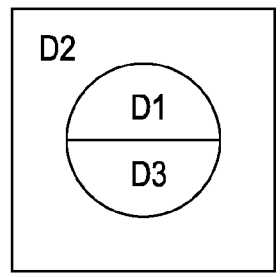
FIGS. 13A to 13F are schematic views illustrating surface relief structures according to other embodiments of the present invention.
Figure 13B:
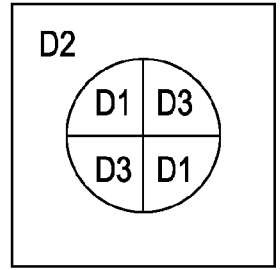
Figure 13C:
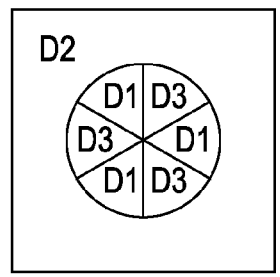
Figure 13D:
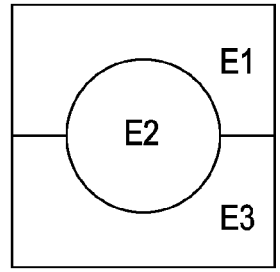
Figure 13E:
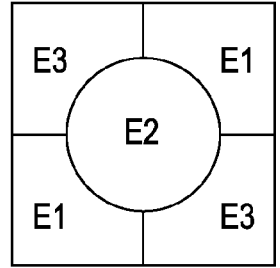
Figure 13F:
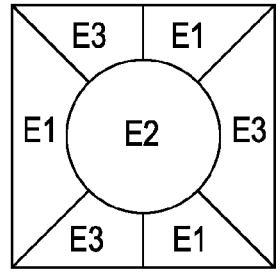

However, as illustrated in FIGS. 13A and 13D, the boundaries in each surface relief structure may include curved boundaries, for example, arc-shaped boundaries.

The high-reflectance regions and the low-reflectance regions may have shapes as described below.

For example, as illustrated in FIGS. 13B, 13C, 13D, and 13F, the arrangement of the divided high-reflectance regions and the divided low-reflectance regions may have rotation symmetry about a normal to a main surface of the substrate. Each of FIGS. 13B and 13C illustrates an exemplary structure in which the divided regions are arranged so as to have two-fold or more rotation symmetry about a normal to a main surface of the substrate.

For the configurations, for example, the intensity distribution of the far-field pattern of light emitted from the VCSEL has rotation symmetry. This can lead to a generally user-friendly beam shape.

For example, in the case where the antinode positions of the light-intensity distribution of the higher-order mode have rotation symmetry, the divided high-reflectance regions or the divided low-reflectance regions are arranged in the positions. This can cause a scattering of the higher-order mode, thereby leading to a single mode oscillation.

For the surface relief structure including the high-reflectance middle portion configured to allow the VCSEL to oscillate in the fundamental mode and the low-reflectance peripheral portion, in the case where the middle portion is divided, the unimodality of the far-field pattern of light emitted from the VCSEL can be maintained rather than the case where the peripheral portion is divided.

Alternatively, although the surface relief structure and the production process are complex, both the low-reflectance region and the high-reflectance region may be divided.

In the case where the surface-emitting lasers (VCSELs) each having the surface relief structure according to aspects of the present invention are arranged in an array to form a surface-emitting laser array, all elements may have the same surface relief structure. Alternatively, the surface-emitting lasers may have different surface relief structures from element to element.

Furthermore, the materials for the surface relief structure according to aspects of the present invention are not limited to semiconductor materials. A metal or dielectric material may be used within the scope of the present invention.

In particular, the single-mode surface-emitting laser (VCSEL) is useful as a light source in the fields of electrophotography, optical communication techniques, and other fields.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-208974, filed Sep. 10, 2009, which is hereby incorporated by reference herein in its entirety.

REFERENCE SIGNS LIST 112 oxidized confinement layer
114 upper multilayer reflector
502 high-reflectance region
504 low-reflectance regions
604 broken line
612 first semiconductor layer
614 second semiconductor layer
616 third semiconductor layer

The invention claimed is:

1. A surface-emitting laser comprising:
a lower multilayer reflector provided on a substrate;
an active layer provided on the lower multilayer reflector;
an upper multilayer reflector provided on the active layer; and
a surface relief structure provided on the upper multilayer reflector,
wherein the surface relief structure includes:
a high-reflectance region in the middle portion of a light exit region, the high-reflectance region having a higher reflectance than a peripheral portion,
a region of a first laminate,
a region of a second laminate that has a larger optical thickness than the first laminate, and
a region of a third laminate that has a larger optical thickness than the first laminate and the second laminate,
wherein the region of the first laminate, the region of the second laminate, and the region of the third laminate are arranged horizontally,
wherein the reflectance of the middle portion of the high-reflectance region including the region of the first laminate and the region of the third laminate is higher than that of the peripheral portion including the region of the second laminate, or
wherein the reflectance of the middle portion of the high-reflectance region including the region of the second laminate is higher than that of the peripheral portion including the region of the first laminate and the region of the third laminate.

2. The surface-emitting laser according to claim 1, wherein the difference in optical thickness between the region of the first laminate and the region of the third laminate is more than $\lambda/4$, wherein $\lambda$ represents the oscillation wavelength of the surface-emitting laser.

3. The surface-emitting laser according to claim 1, wherein the region of the first laminate is divided into first subregions, and the region of the third laminate is divided into third subregions, and the first subregions and the third subregions are arranged so as to have two-fold or more rotation symmetry about a normal to a main surface of the substrate.

4. A surface-emitting laser array comprising:
the surface-emitting lasers according to claim 1,
wherein the surface-emitting lasers are arranged in an array.

* * * * *